United States Patent
Sekino et al.

[19]

[11] Patent Number: 6,066,973

[45] Date of Patent: May 23, 2000

[54] SEMICONDUCTOR INTEGRATED CIRCUIT HAVING INPUT CIRCUIT

[75] Inventors: Yoshimasa Sekino; Katuaki Matui, both of Tokyo, Japan

[73] Assignee: Oki Electric Industry Co., Ltd., Tokyo, Japan

[21] Appl. No.: 09/050,461

[22] Filed: Mar. 31, 1998

[30] Foreign Application Priority Data

Nov. 27, 1997 [JP] Japan .................................. 9-344131

[51] Int. Cl.[7] .............................. H03K 5/00; H03K 3/01
[52] U.S. Cl. ........................ 327/313; 327/311; 327/310; 327/558; 327/427; 327/437; 327/552; 326/30
[58] Field of Search .................................. 327/551, 552, 327/311, 108, 427, 437, 558; 326/30

[56] References Cited

U.S. PATENT DOCUMENTS 4,645,951   2/1987   Uragami ................................... 326/30

*Primary Examiner*—Dinh Le
*Attorney, Agent, or Firm*—Jones Volentine, LLP

[57] ABSTRACT

An input circuit is made up of an external signal input portion which inputs an external signal, a voltage level converting circuit which has an input terminal for inputting a signal from the external signal input circuit and which has an output terminal for outputng the signal to the internal circuit after a voltage level was converted, a first power supply terminal which has a first potential for driving the voltage level converting circuit, a second power supply terminal which has a second potential for driving the voltage level converting circuit, and a noise control portion which couples to the input terminal of the voltage level converting circuit, which controls a noise from the first power supply terminal and/or the second power supply terminal, and which has a first capacitor. Accordingly, the input circuit could be applied the stable signal to the internal circuit.

9 Claims, 8 Drawing Sheets

SEMICONDUCTOR INTEGRATED CIRCUIT HAVING INPUT CIRCUIT

BACKGROUND OF THE INVENTION

1. Field of the Invention

The present invention generally relates to a semiconductor integrated circuit, and more particularly, the present invention relates to an input circuit which converts a voltage level of an external signal and which performs a matching of a logic level.

This application is a counterpart of Japanese application Serial Number 344131/1997, filed Nov. 27, 1997, the subject matter of which is incorporated herein by reference.

2. Description of the Related Art

FIG. 1 is a circuit diagram showing an input circuit according to a conventional semiconductor integrated circuit.

As shown in FIG. 1, the input circuit 101 is made up of a bonding pad BP, a noise absorption portion NP, an inverter IV1 as a voltage level converting circuit, and an inverter IV2. In this circuit, the noise absorption portion NP is made up of a resistor R1, and an N-channel MOS transistor 107, and is used for absorbing electrostatic noise. The inverter IV1 is made up of a P-channel MOS transistor 103 and an N-channel MOS transistor 105. The external signal Sin is inputted from the bonding pad BP, which connected to a drain of the N-channel MOS transistor 107 and to the resistor R1. The N-channel MOS transistor 107 has a gate and a source which are connected to a ground potential GND. The resistor R1 is connected to respective gates of the P-channel MOS transistor 103 and the N-channel MOS transistor 105 via a node N1. The drain of the P-channel MOS transistor 103 is connected to the drain of the N-channel MOS transistor 105 via a node N2. The node N2 is connected to an input terminal of the inverter IV2. The P-channel MOS transistor 103 has a source which is connected to a power supply voltage Vcc. The N-channel MOS transistor 105 has a source which is connected to a ground potential GND. The inverter IV2 has an output terminal which is connected to an internal circuit IS.

FIG. 2 is a diagram for describing an operation of an input circuit according to a conventional semiconductor integrated circuit.

As shown in FIG. 2, in a semiconductor integrated circuit having a supply voltage Vcc of 3.3 V, when assuring LVTTL level as a voltage amplitude, an H level of the eternal signal Sin is defined so as to be more than 2.0 V and an L level of the external signal Sin is defined so as to be less than 0.8 V. When the external signal Sin having a lowest voltage for an H level of 2.0 V is inputted to the bonding pad BP, the external signal Sin is applied to the node N1 via the noise absorption portion NP. Any disturbance surge current within the external signal Sin is removed by the noise absorption portion NP. The voltage 2.0 V applied to the node N1 is applied to the respective gates of the P-channel MOS transistor 103 and the N-channel MOS transistor 105. At this time, the power supply voltage Vcc is defined as 3.3 V, and therefore a gate-source voltage of the P-channel MOS transistor 103 is defined as −1.3 V. As a result, the P-channel MOS transistor 103 turns on. On the other hand, a gate-source voltage of the N-channel MOS transistor 105 is defined as 2.0 V. As a result, the N-channel MOS transistor 105 also turns on. Therefore, both of the P-channel MOS transistor 103 and the N-channel MOS transistor 105 turn on, but absolute value of the gate-source voltage of the N-channel MOS transistor 105 is larger than that of the P-channel MOS transistor 103, as a result the node N2 becomes a potential VL closed to the ground potential. In this time, the potential VL of the node N2 is a sufficient low value compared to a threshold voltage Vth of the inverter IV2, as a result the inverter IV2 outputs an H level signal to the internal circuit IS. Next, the external signal Sin changes from an H level of 2.0 V to an L level of 0.8 V during time t1 to time t2. As a result gate potentials of the P-channel MOS transistor 103 and the N-channel MOS transistor 105 become 0.8 V. Accordingly, the gate-source voltage of the P-channel MOS transistor 103 becomes −2.5 V and the P-channel MOS transistor 103 continuously has turned on. On the other hand, the gate-source voltage of the N-channel MOS transistor 105 becomes 0.8 V and the N-channel MOS transistor 105 continuously has turned on. Therefore, both of the P-channel MOS transistor 103 and the N-channel MOS transistor 105 turn on, but an absolute value of the gate-source voltage of the P-channel MOS transistor 103 is larger than that of the N-channel MOS transistor 105, and as a result the node N2 becomes a potential VH closed to the power supply voltage Vcc. In this time, the potential VH of the node N2 becomes sufficient high value compared to a threshold voltage Vth of the inverter N2, as a result the inverter IV2 outputs an L level signal to the internal circuit IS.

SUMMARY OF THE INVENTION

An object of the present invention is to provide an input circuit which applies a stable signal to an internal circuit.

According to one aspect of the present invention, for achieving the above object, there is provided an input circuit comprising: an external signal input portion which inputs an external signal; an internal circuit; a voltage level converting circuit which converts a voltage level of the external signal to obtain a converted signal, and which includes an input terminal for receiving the external signal via the external signal input circuit and an output terminal for outputting the converted signal to the internal circuit; a first power supply terminal which supplies a first potential for driving the voltage level converting circuit; a second power supply terminal which supplies a second potential for driving the voltage level converting circuit; and a noise control portion coupled to the input terminal of the voltage level converting circuit, which controls noise entering from at least one of the first power supply terminal and the second power supply terminal, and which includes a first capacitor.

BRIEF DESCRIPTION OF THE DRAWINGS

While the specification concludes claims particularly pointing out and distinctly claiming the subject matter that is regarded as the invention, the invention, along with the objects, features, and advantages thereof, will be better understood from the following description taken in connection with the accompanying drawings, in which:

DETAILED DESCRIPTION OF THE PREFERRED EMBODIMENTS

A semiconductor memory device according to the present invention will hereinafter be described in detail with reference to the accompanying drawings.

Figure 1:
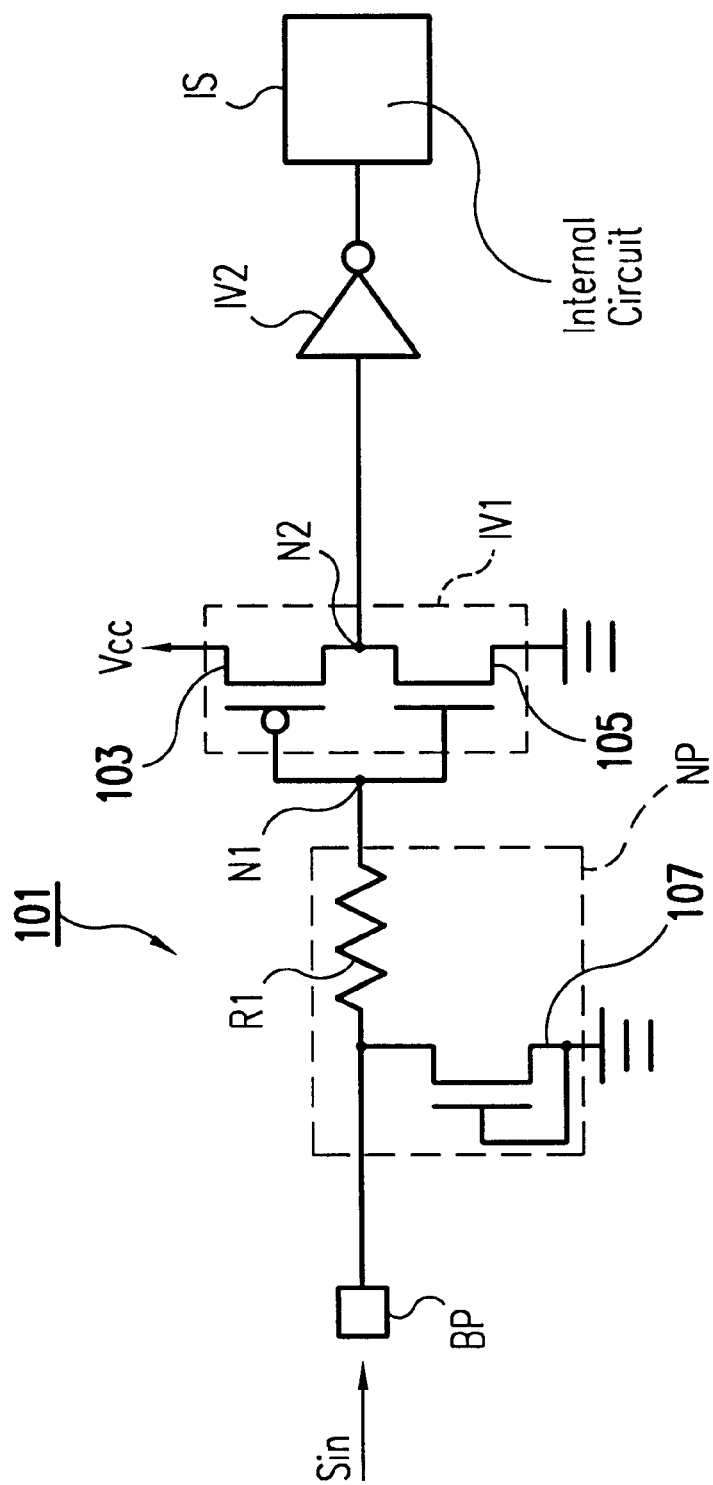
FIG. 1 is a circuit diagram showing an input circuit according to a conventional semiconductor integrated circuit.
Figure 2:
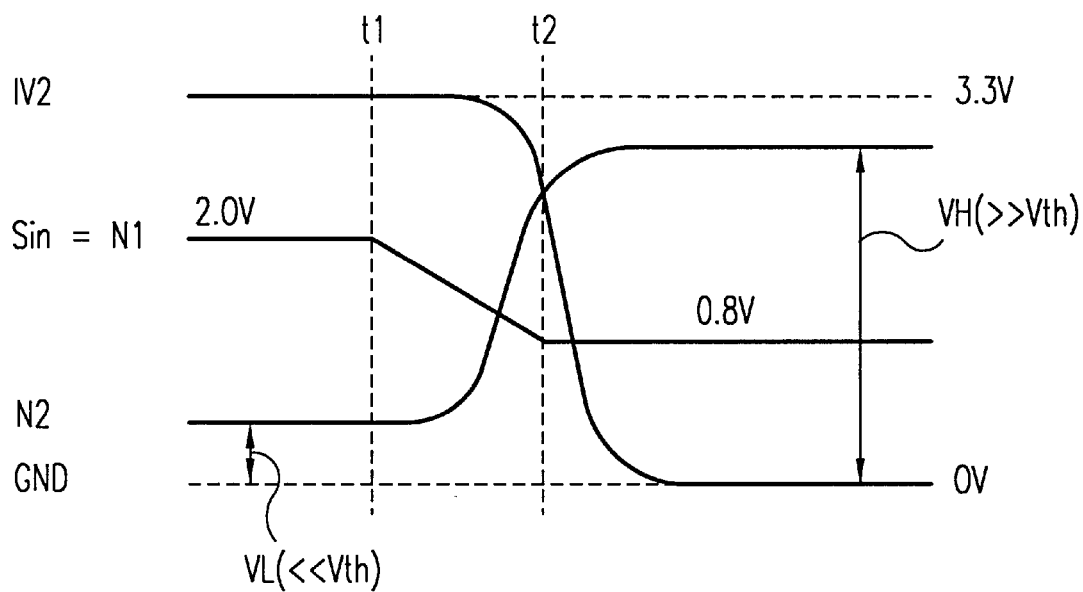
FIG. 2 is a diagram for describing an operation of an input circuit according to a conventional semiconductor integrated circuit.
Figure 3:
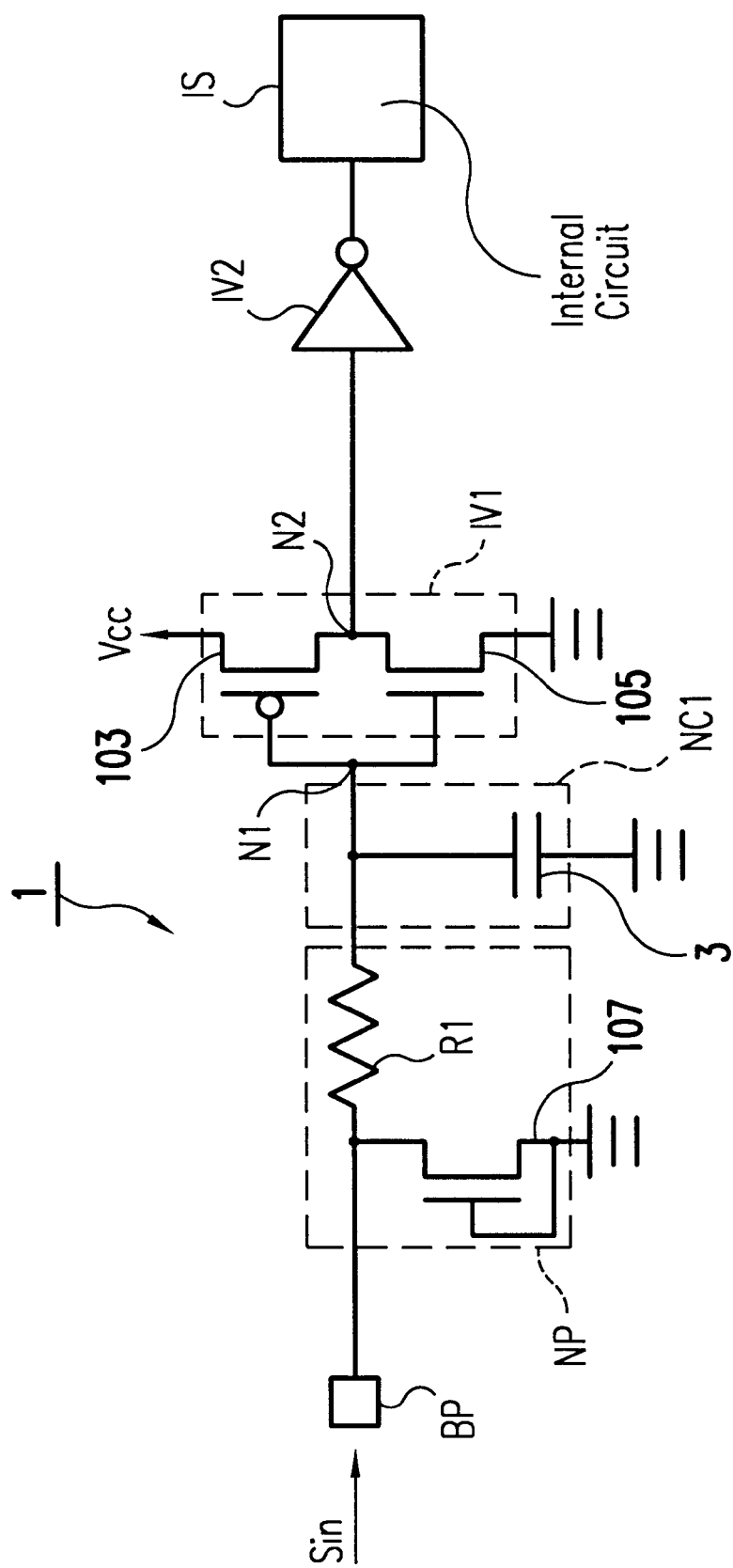
FIG. 3 is a circuit diagram showing an input circuit according to a first preferred embodiment of a present invention.

FIG. 3 is a circuit diagram showing an input circuit according to a first preferred embodiment of a present invention.

As shown in FIG. 3, the input circuit 1 is made up of a bonding pad BP as an external signal input portion, a noise absorption portion NP, a noise control portion NC1, an inverter IV1 as a voltage level converting circuit, and an inverter IV2. In this circuit, the noise absorption portion NP is made up of a resistor R1, and an N-channel MOS transistor 107, and absorbs electrostatic noise. The noise control portion NC1 is made up of a capacitor 3. The inverter IV1 is made up of a P-channel MOS transistor 103 and an N-channel MOS transistor 105. The bonding pad BP is inputted an external signal Sin, and is connected to a drain of the N-channel MOS transistor 107 and the resistor R1. The N-channel MOS transistor 107 has a gate and a source which are connected to a ground potential GND. The resistor R1 is connected to respective gates of the P-channel MOS transistor 103 and the N-channel MOS transistor 105 via a node N1. The capacitor 3 is connected to the node N1 and a ground potential GND. The drain of the P-channel MOS transistor 103 is connected to the drain of the N-channel MOS transistor 105 via a node N2. The node N2 is connected to an input terminal of the inverter IV2. The P-channel MOS transistor 103 has a source which is connected to a power supply voltage Vcc. The N-channel MOS transistor 105 has a source which is connected to a ground potential GND. The inverter IV2 has an output terminal which is connected to an internal circuit IS.

As the mentioned above, the input circuit according to the first preferred embodiment is characterized by the noise control portion NC1 connected between the noise absorption portion NP and the inverter IV1.

Figure 4:
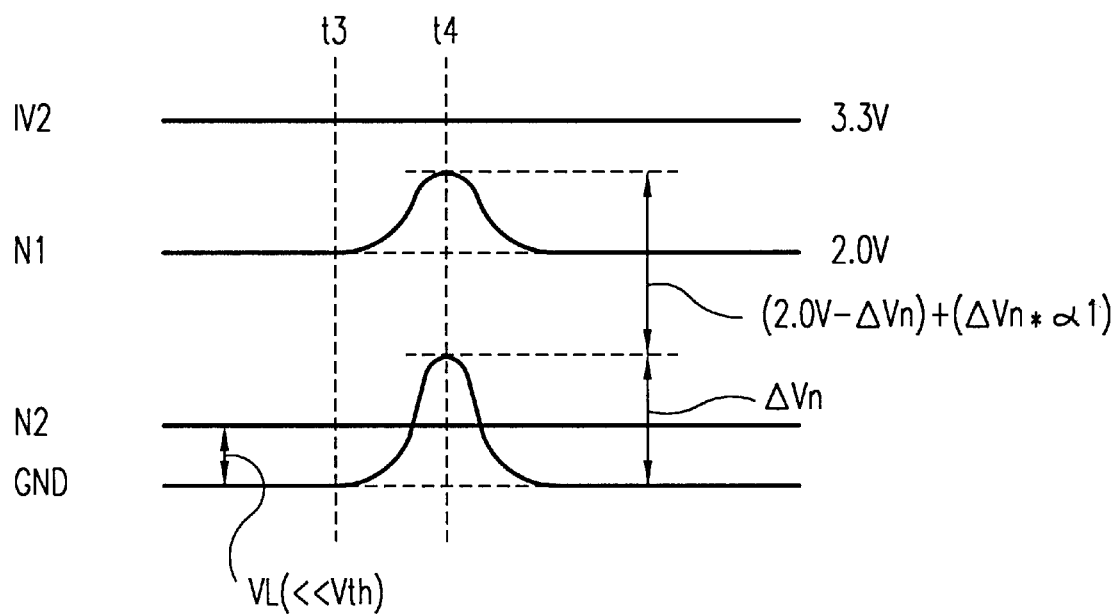
FIG. 4 is a diagram for describing an operation of an input circuit according to a first preferred embodiment of a present invention.

FIG. 4 is a diagram for describing an operation of an input circuit according to the first preferred embodiment of a present invention.

As shown in FIG. 4, when the external signal Sin having a lowest voltage 2.0 V of an H level, which is inputted from the bonding pad BP, the external signal Sin is applied to the node N1 via the noise absorption portion NP. Any disturbance surge current in the external signal Sin is removed by the noise absorption portion NP. The voltage 2.0 V applied to the node N1 is applied to the respective gates of the P-channel MOS transistor 103 and the N-channel MOS transistor 105. In this time, the power supply voltage Vcc has defined 3.3 V, therefore a gate-source voltage of the P-channel MOS transistor 103 is defined −1.3 V. As a result, the P-channel MOS transistor 103 turns on. On the other hand, a gate-source voltage of the N-channel MOS transitor 105 is defined 2.0 V. As a result, the N-channel MOS transistor 105 also turns on. Therefore, both of the P-channel MOS transistor 103 and the N-channel MOS transistor 105 turn on, but absolute value of the gate-source voltage of the N-channel MOS transistor 105 is larger than that of the P-channel MOS transistor 103, as a result the node N2 becomes a potential VL closed to the ground potential GND. In this time, the potential VL of the node N2 becomes sufficient low value compared to a threshold voltage Vth of the inverter IV2, as a result the inverter IV2 outputs an H level signal to the internal circuit IS.

At the time t3, when the input circuit 1 performs, consumption current occur in the input circuit 1, as a result noise occur on the ground potential GND. By occurring the noise, the ground potential temporary rises to ΔVn, as a result a gate-source voltage of the N-channel MOS transistor 105 falls to (2.0 V−ΔVn). However, the gate of the N-channel MOS transistor 105 and the ground potential GND are capacitive coupled by the capacitor 3, and therefore the noise voltage ΔVn generated in the ground potential GND is transferred to the node N1 as (ΔVn×α1). Here, α1 is a transmission efficiency of the noise voltage ΔVn transferred to the node N1 via the capacitor 3.

As the mentioned above, by transferring the noise voltage ΔVn to the node N1 via the capacitor 3, the gate-source voltage of the N-channel MOS transistor 105 becomes ((2.0 V−ΔVn) +(ΔVn×α1)) and it could be avoided to decrease the current driving ability of the N-channel MOS transistor 105. On the other hand, the source of the P-channel MOS transistor 103 doesn't directly receive the influence of generating the noise in the ground potential GND, and therefore the gate-source voltage of the P-channel MOS transistor 103 becomes ((−0.3 V)+(ΔVn×α1)). Therefore, by transferring the noise voltage ΔVn generated in the ground potential GND to the node N1, the current driving ability of the P-channel MOS transistor 103 decreases. After that, the noise of the ground potential GND decreases at the time t4, then the noise voltage ΔVn transferred to the node N1 via the capacitor 3 also decreases and the potential of the node N1 returns the potential 2.0 V of tie external signal Sin.

As the mentioned above, in the input circuit according to the first preferred embodiment, the current driving ability of the N-channel MOS transistor 105 doesn't decreases even if the noise generated in the ground potential GND. On the other hand, the current driving ability of the P-channel MOS transistor 103 decreases, and therefore the potential VL in the node N2 isn't more than the threshold voltage of the inverter IV2. Accordingly, the input circuit can apply the stable signal to the internal circuit IS.

Further, the input circuit according to the first preferred embodiment may be used the capacitor 3 so as to connect between the node N1 and the power supply voltage Vcc. Therefore, the input circuit can apply the stable signal to the inverter IV2 even if the noise generated in the power supply voltage Vcc. Further, the input circuit according to the first preferred embodiment may be used the capacitor 3 so as to connect between the node N1 and the power supply voltage Vcc and may be used the other capacitor so as to connect between the node N1 and the ground potential GND. Therefore, the input circuit can apply the stable signal to the inverter IV2 even if the noise generated in the power supply voltage Vcc or the ground potential GND.

Figure 5:
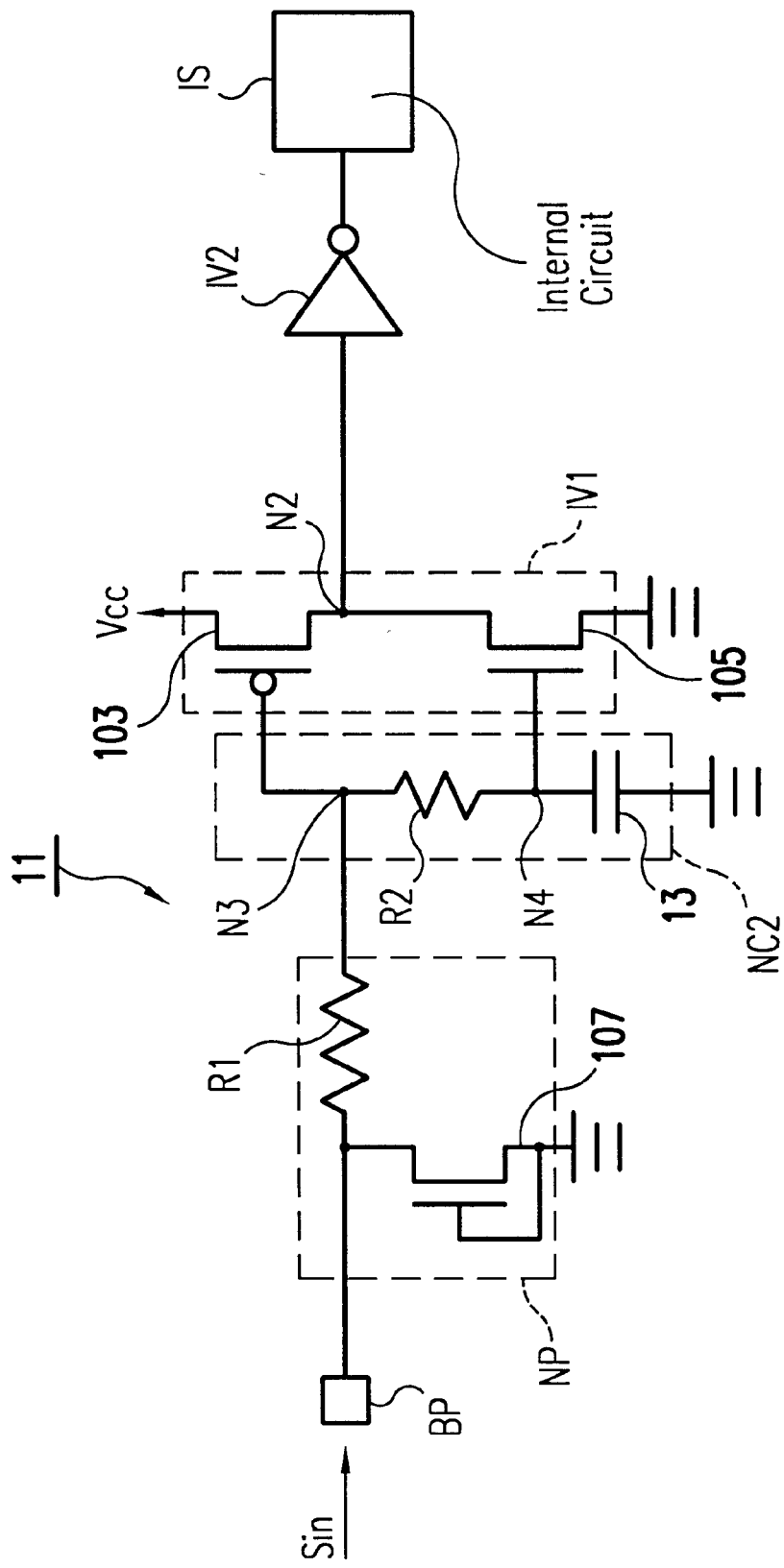
FIG. 5 is a circuit diagram showing an input circuit according to a second preferred embodiment of a present invention.

FIG. 5 is a circuit diagram showing an input circuit according to a second preferred embodiment of a present invention.

As shown in FIG. 5, the input circuit 11 is made up of a bonding pad BP as an external signal input portion, a noise absorption portion NP, a noise control portion NC2, an inverter IV1 as a voltage level converting circuit, and an inverter IV2. In this circuit, the noise control portion NC2 is made up of a capacitor 13 and a resistor R2. The noise absorption portion NP is made up of an N-channel MOS transistor 107 and a resistor R1. The inverter IV1 is made up of a P-channel MOS transistor 103 and an N-channel MOS transistor 105. The bonding pad BP is inputted an external signal Sin, which connected to a drain of the N-channel MOS transistor 107 and the resistor R1. The N-channel MOS transistor 107 has a gate and a source which are connected to a ground potential GND. The resistor R1 is connected to a gate of the P-channel MOS transistor 103 and the resistor R2 via a node N3. The resistor R2 is connected to a gate of the N-channel MOS transistor 105 and the capacitor 13 via a node N4. The capacitor 13 is connected to a ground potential GND. The drain of the P-channel MOS transistor 103 is connected to the dran of the N-channel MOS transistor 105 via a node N2. The node N2 is connected to an input terminal of the inverter IV2. The P-channel MOS transistor 103 has a source which is connected to a power supply voltage Vcc. The N-channel MOS transistor 105 has a source which is connected to a ground potential GND. The inverter IV2 has an output terminal which is connected to an internal circuit IS.

Figure 6:
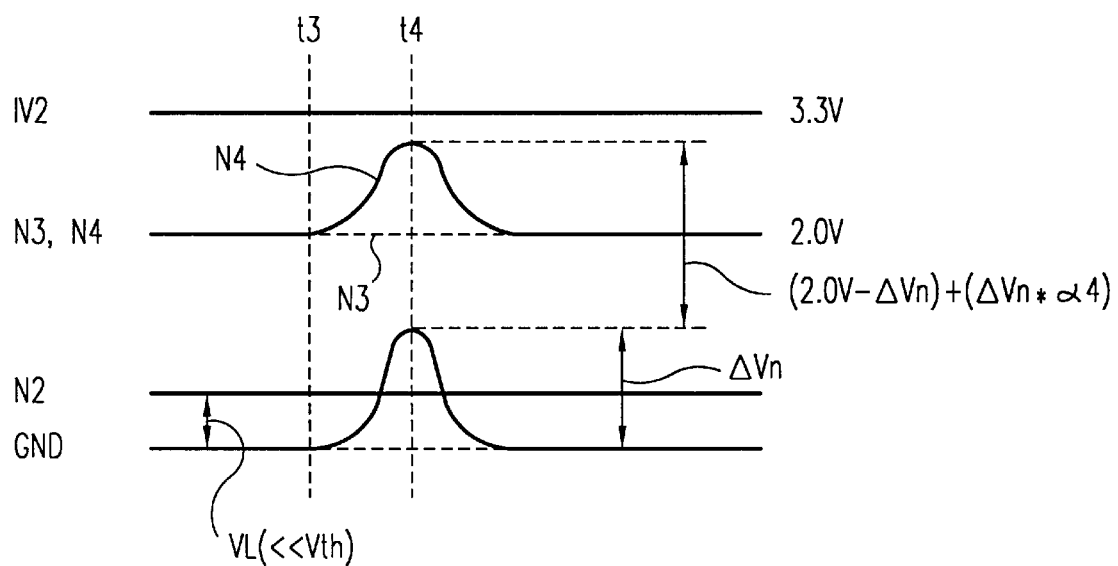
FIG. 6 is a diagram for describing an operation of an input circuit according to a second preferred embodiment of a present invention.

FIG. 6 is a diagram for describing an operation of an input circuit according to a second preferred embodiment of a present invention.

As shown in FIG. 6, when the external signal Sin having a lowest voltage 2.0 V of an H level, which is inputted from the bonding pad BP, the external signal Sin is applied to the node N3 via the noise absorption portion NP. The voltage 2.0 V applied to a gate of the P-chanmel MOS transistor 103 and applied to a gate of the N-channel MOS transistor 105 via the resistor R2. In this time, the power supply voltage Vcc has defined 3.3 V, therefore a gatsource voltage of the P-channel MOS transistor 103 is defined −1.3 V. As a result, the P-channel MOS transistor 103 turns on. On the other hand, a gate-source voltage of the N-channel MOS transistor 105 is defined 2.0 V. As a result, the N-channel MOS transistor 105 also turns on. Therefore, both of the P-channel MOS transistor 103 and the N-channel MOS transistor 105 turn on, but absolute value of the gate-source voltage of the N-channel MOS transistor 105 is larger than that of the P-channel MOS transistor 103, as a result the node N2 becomes a potential VL closed to the ground potential GND. In this time, the potential VL of the node N2 becomes sufficient low value compared to a threshold voltage Vth of the inverter IV2, as a result the inverter IV2 outputs an H level signal to the internal circuit IS.

At the time t3, when the input circuit 11 performs, consumption current occur in the input circuit 11, as a result noise occur on the ground potential GND. By occuring the noise, the ground potential temporary rises to ΔVn, as a result a gate-source voltage of the N-channel MOS transistor 105 falls to (2.0 V−ΔVn). However, since the gate of the N-channel MOS transistor 105 and the ground potential GND are capacitive coupled by the capacitor 13, the noise voltage ΔVn generated in the ground potential GND is transferred to the node N4 as (ΔVn×α4). Here, α4 is a transmission efficiency of the noise voltage ΔVn transferred to the node N4 via the capacitor 13.

As the mentioned above, by transferring the noise voltage ΔVn to the node N4 via the capacitor 13, the gate-source voltage of the N-channel MOS transistor 105 becomes ((2.0 V−ΔVn) +(ΔVn×α4)). However, since the nodes N3 and N4 are separated by the resistor R2 it could be avoided a parasite capacitance in te node N4. Therefore, the noise voltage ΔVn generated in the ground potential GND could be efficiency transferred to the N-channel MOS transistor 105, as a result the gate-source voltage of the N-channel MOS transistor 105 could be nearly 2.0 V at the time t4. The noise would be efficiency transferred to the node N4 during the noise transferred to the node N4 via the capacitor 13 from the ground potential GND transfers to the node N3. After that, the noise of the ground potential GND decreases at the time t4, then the noise voltage (ΔVn×α4) transferred to the node N4 via the capacitor 13 also decreases and the potential of the node N4 returns the potential 2.0 V of the external signal Sin.

As the mentioned above, in the input circuit 11 according to the second preferred embodiment, the noise is transferred to the node N4 by the capacitor 13 and the current driving ability of the N-channel MOS transistor 105 could be avoided to decrease even if the noise generated in the ground potential GND. Accordingly, since the potential VL in the node N2 isn't more than the threshold voltage of the inverter IV2, the input circuit can apply the stable signal to the internal circuit IS. Further, since the node N3 and the node N4 are separated by the resistor R2, the parasite capacitance decreases in the node N3. Accordingly, the second preferred embodiment could be used the capacitor 13 which has a small capacitance. As a result, the second preferred embodiment could be simplified the circuitry of the input circuit.

Further, the input circuit according to the second preferred embodiment may be used the capacitor 13 so as to connect between the node N4 and the power supply voltage Vcc. Therefore, the input circuit can apply the stable signal to the inverter IV2 even if the noise generated in the power supply voltage Vcc. Further, the input circuit according to the second preferred embodiment may be used the capacitor 13 so as to connect between the node N4 and the power supply voltage Vcc and may be used the other capacitor so as to connect between the node N4 and the ground potential GND. Therefore, the input circuit can apply the stable signal to the inverter IV2 even if the noise generated in the power supply voltage Vcc or the ground potential GND.

Figure 7:
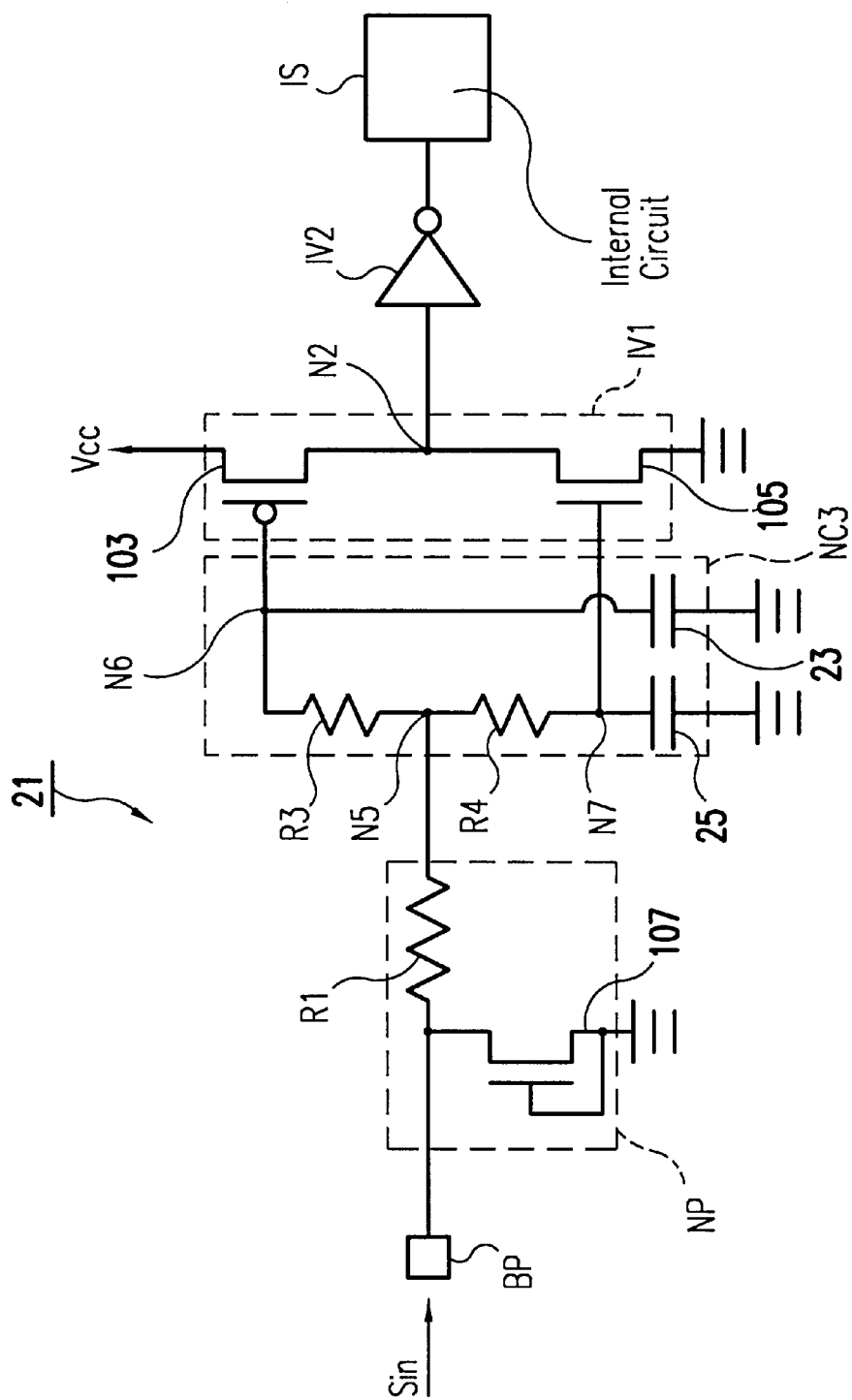
FIG. 7 is a circuit diagram showing an input circuit according to a third preferred embodiment of a present invention.

FIG. 7 is a circuit diagram showing an input circuit according to a third preferred embodiment of a present invention.

As shown in FIG. 7, the input circuit 21 is made up of a bonding pad BP as an external signal input portion, a noise absorption portion NP, a noise control portion NC3, an inverter IV1 as a voltage level converting circuit, and an inverter IV2. In this circuit, the noise control portion NC3 is made up of capacitors 23 and 25 and resistors R3 and R4. The noise absorption portion NP is made up of an N-channel MOS transistor 107 and a resistor R1. The inverter IV1 is made up of a P-channel MOS transistor 103 and an N-channel MOS transistor 105. The bonding pad BP is inputted an external signal Sin, which connected to a drain of the N-channel MOS transistor 107 and the resistor R1. The N-channel MOS transistor 107 has a gate and a source which are connected to a ground potential GND. The resistor R1 is connected to the resistors R3 and R4 via a node N5. The resistor R3 is connected to a gate of the P-channel MOS transistor 103 and the capacitor 23 via a node N6. The capacitor 23 is connected to a ground potential GND. The resistor R4 is connected to the capacitor 25 and a gate of the N-channel MOS transistor 105 via the node N7. The capacitor 25 is connected to the ground potential GND. The drain of the P-channel MOS transistor 103 is connected to the drain of the N-channel MOS transistor 105 via a node N2. The node N2 is connected to an input terminal of the inverter IV2. The P-channel MOS transistor 103 has a source which is connected to a power supply voltage Vcc. The N-channel MOS transistor 105 has a source which is connected to a ground potential GND. The inverter IV2 has an output terminal which is connected to an internal circuit IS.

Figure 8:
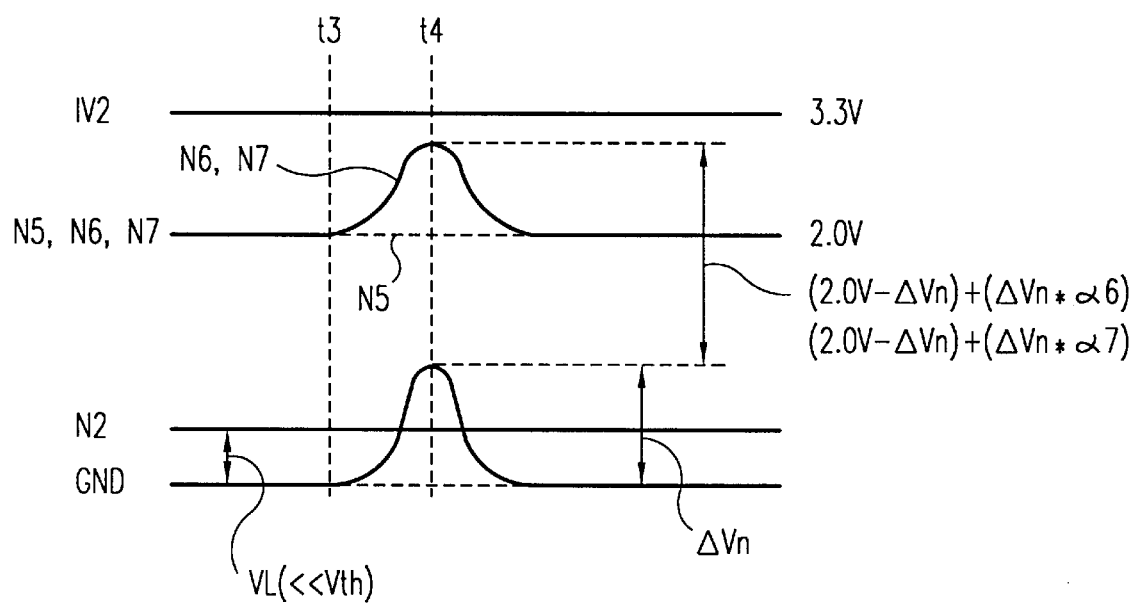
FIG. 8 is a diagram for describing an operation of an input circuit according to a third preferred embodiment of a present invention.

FIG. 8 is a diagram for describing an operation of an input circuit according to a third preferred embodiment of a present invention.

As shown in FIG. 8, when the external signal Sin having a lowest voltage 2.0 V of an H level, which is inputted from the bonding pad BP, the external signal Sin is applied to the node N5 via the noise absorption portion NP. The voltage 2.0 V applied to a gate of the P-channel MOS trtransistor 103 via the resistor R3 and applied to a gate of the N-channel MOS transistor 105 via the resistor R4. In this time, the power supply voltage Vcc has defined 3.3 V, therefore a gate-source voltage of the P-channel MOS transistor 103 is defined −1.3 V. As a result, the P-channel MOS transistor 103 turns on. On the other hand, a gate-source voltage of the N-channel MOS transistor 105 is defined 2.0 V. As a result, the N-channel MOS transistor 105 also turns on. Therefore, both of the P-channel MOS transistor 103 and the N-channel MOS transistor 105 turn on, but absolute value of the gate-source voltage of the N-channel MOS transistor 105 is larger than that of the P-channel MOS transistor 103, as a result the node N2 becomes a potential VL closed to the ground potential GND. In this time, the potential VL of the node N2 becomes sufficient low value compared to a threshold voltage Vth of the inverter IV2, as a result the inverter IV2 outputs an H level signal to the internal circuit IS.

At the time t3, when the input circuit 21 performs, consumption current occur in the input circuit 21, as a result noise occur on the ground potential GND. By occurring the noise, the ground potential temporary rises to ΔVn, as a result a gate-source voltage of the N-channel MOS transistor 105 falls to (2.0 V−ΔVn). However, since the gate of the N-channel MOS transistor 105 and the ground potential GND are capacitive coupled by the capacitor 25, the noise voltage ΔVn generated in the ground potential GND is transferred to the node N7 as (ΔVn×α7). Here, α7 is a transmission efficiency of the noise voltage ΔVn transferred to the node N7 via the capacitor 25.

As the mentioned above, by tansferring the noise voltage ΔVn to the node N7 via the capacitor 25, the gate-source voltage of the N-channel MOS transistor 105 becomes ((2.0V−ΔVn) +(ΔVn×α7)). However, since the nodes N7 and N5 are separated by the resistor R4, it could be avoided a parasite capacitance in the node N7. Therefore, the noise voltage ΔVn generated in the ground potential GND could be efficiency transferred to the gate of the N-channel MOS transistor 105, as a result the gate-source voltage off the N-channel MOS transistor 105 could be nearly 2.0 V at the time t4. The noise could be efficiency transferred to the node N7 during the noise transferred to the node N7 via the capacitor 25 from the ground potential GND transfers to the node N5.

On the other hand, when the noise occurs in the ground potential GND at the time t3, the noise voltage ΔVn in the ground potential GND is transferred to the node N6 as (ΔVn×α6) since the gate of the N-channel MOS transistor 103 and the ground potential GND are capacitive coupled by the capacitor 23. Here, α6 is a transmission efficiency of the noise voltage ΔVn transferred to the node N6 via the capacitor 23.

As the mentioned above, by transferring the noise voltage ΔVn to the node N6 via the capacitor 23, the gate-source voltage of the N-channel MOS transistor 103 becomes ((−1.3 V) +(ΔVn×α6)). However, since the nodes N6 and N5 are separated by the resistor R3, it could be avoided a parasite capacitance in the node N6. Therefore, the noise voltage ΔVn generated in the ground potential GND could be efficiency transferred to the gate of the N-channel MOS transistor 103. The noise could be efficiency transferred to the node N6 during the noise transferred to the node N6 via the capacitor 23 from the ground potential GND transfers to the node NS. After that, the noise of the ground potential GND decreses at the time t4, as a result the noise voltage (ΔVn×α6) transferred to the node N6 via the capacitor 23 and the noise voltage (ΔVn×α7) transferred to the node N7 via the capacitor 25 also decreases. Then, the potentials of the nodes N6 and N7 return the potential 2.0 V of the external signal Sin. As the mentioned above, in the input circuit 21 according to the third preferred embodiment, the noise is transferred to the node N7 by the capacitor 25 and the current driving ability of the N-channel MOS transistor 105 could be avoided to decrease even if the noise generated in the ground potential GND. Simultaneously, the noise is transferred to the node N6 by the capacitor 23 and it could be decrease the current driving ability of the P-channel MOS transistor 103. Accordingly, the potential VL in the node N2 isn't more than the threshold voltage of the inverter IV2, and therefore the input circuit can apply the stable signal to te internal circuit IS. Further, the node N5 and the node N6 are separated by the resistor R3, and therefore the parasite capacitance decreases in the node N6. Accordingly, the third preferred embodiment could be used the capacitor 23 which has a small capacitance, Further, the node N5 and the node N7 are separated by the resistor R4, and therefore the parasite capacitance decreases in the node N7. Accordingly, the third preferred embodiment could be used the capacitor 25 which has a small capacitance. As a result, the third preferred embodiment could be simplified the circuitry of the input circuit.

Further, the input circuit according to the third preferred embodiment may be used the capacitor 23 so as to connect between the node N6 and the power supply voltage Vcc or may be used the capacitor 25 so as to connect between the node N7 and the power supply voltage Vcc. Further, the input circuit according to the third preferred embodiment may be used both of the capacitors 23 and 25 so as to connect to the power supply voltage Vcc or the ground potential GND. Therefore, the input circuit can apply the stable signal to the inverter IV2 even if the noise generated in the power supply voltage Vcc or the ground potential GND.

While the present invention has been described with reference to the illustrative embodiments, this description is not intended to be construed in a limiting sense. Various modifications of the illustrative embodiments, as well as other embodiments of the invention, will be aparent to those skilled in the art on reference to this description. It is therefore contemplated that the appended claims will cover any such modifications or embodiments as fall within the true scope of the invention.

What is claimed is:

1. An input circuit for supplying a signal to an internal circuit, said input circuit comprising:

an external signal input terminal which receives an external signal;

a noise absorption circuit, coupled to said external input terminal, which absorbs a noise mixed in the external signal and which outputs a corresponding noise-absorbed external signal at an output thereof;

a first power supply terminal which supplies a first potential;

a second power supply terminal which supplies a second potential;

a noise control circuit, coupled to the output of said noise absorption circuit and having first and second outputs, which includes a first capacitor coupled between the second output and said second power supply terminal, and a first resistor coupled between the second output and the output of said noise absorption circuit; and a voltage level converting circuit which converts a voltage level of the noise absorbed external signal to obtain a converted signal for outputting to the internal circuit, which is driving by the first and second potentials supplied by said first and second power supply terminals, respectively, and which includes a first input terminal coupled to said first output of said noise control circuit and a second input terminal coupled to said second output of said noise control circuit.

2. An input circuit as claimed in claim 1, wherein the noise control circuit further includes a second capacitor connected between the first output and the second power supply terminal.

3. An input circuit as claimed in claim 1, wherein the voltage level converting circuit comprises a P-channel transistor and an N-channel transistor, the P-channel transistor and the N-channel transistor having drain terminals connected to the an output terminal of the voltage level converting circuit, the P-channel transistor having a source terminal connected to the first power supply terminal, the N-channel transistor having a source terminal connected to the second power supply terminal.

4. The input circuit as claimed in claim 3, wherein the P-channel transistor and the N-channel transistor have first and second gate terminals, respectively, the first gate terminal connected to the first input terminal, and the second gate terminal connected to the second input terminal.

5. An input circuit as claimed in claim 4, wherein the P-channel and N-channel transistors are MOS transistors.

6. An input circuit as claimed in claim 1, wherein the first potential is a power supply voltage and the second potential is a ground potential.

7. An input circuit as claimed in claim 2, wherein the noise control circuit further comprises a second resistor connected between the first output and the output of the noise absorption circuit.

8. An input circuit as claimed in claim 5, wherein the noise control circuit further includes a second capacitor connected between the first output and the second power supply terminal.

9. An input circuit as claimed in claim 8, wherein the noise control circuit further comprises a second resistor connected between the first output and the output of the noise absorption circuit.

* * * * *